United States Patent
Liljeberg et al.

(10) Patent No.: US 12,148,742 B2
(45) Date of Patent: Nov. 19, 2024

(54) ACTIVE BRIDGE ENABLED CO-PACKAGED PHOTONIC TRANSCEIVER

(71) Applicant: Intel Corporation, Santa Clara, CA (US)

(72) Inventors: Thomas Liljeberg, San Jose, CA (US); Andrew C. Alduino, San Jose, CA (US); Ravindranath Vithal Mahajan, Chandler, AZ (US); Ling Liao, Fremont, CA (US); Kenneth Brown, Tempe, AZ (US); James Jaussi, El Dorado Hills, CA (US); Bharadwaj Parthasarathy, San Jose, CA (US); Nitin A Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1095 days.

(21) Appl. No.: 16/816,669

(22) Filed: Mar. 12, 2020

(65) Prior Publication Data
US 2021/0288035 A1    Sep. 16, 2021

(51) Int. Cl.
| | |
|---|---|
| G02B 6/42 | (2006.01) |
| H01L 23/00 | (2006.01) |
| H01L 23/36 | (2006.01) |
| H01L 23/367 | (2006.01) |
| H01L 25/16 | (2023.01) |
| H04B 10/40 | (2013.01) |

(52) U.S. Cl.
CPC .......... *H01L 25/167* (2013.01); *G02B 6/4268* (2013.01); *G02B 6/428* (2013.01); *H01L 23/3675* (2013.01); *H01L 24/16* (2013.01); *H01L 24/17* (2013.01); *H04B 10/40* (2013.01); *H01L 2224/16145* (2013.01); *H01L 2224/16225* (2013.01); *H01L 2224/1703* (2013.01); *H01L 2224/17051* (2013.01)

(58) Field of Classification Search
CPC ............................. G02B 6/42; H01L 23/3675
USPC .......................................................... 385/14
See application file for complete search history.

(56) References Cited

U.S. PATENT DOCUMENTS

| | | | | |
|---|---|---|---|---|
| 5,742,418 A | * | 4/1998 | Mizutani | H04B 10/532 372/27 |
| 5,835,458 A | * | 11/1998 | Bischel | G11B 7/1353 369/44.29 |
| 5,880,838 A | * | 3/1999 | Marx | G01B 11/2441 250/237 G |

(Continued)

FOREIGN PATENT DOCUMENTS

TW    201246637 A    11/2012

OTHER PUBLICATIONS

European Extended Search Report issued in EP Application No. 20207801.0 on Apr. 29, 2021; 7 pages.

*Primary Examiner* — Kaveh C Kianni
(74) *Attorney, Agent, or Firm* — Akona IP PC (57) ABSTRACT

Embodiments may relate to a microelectronic package that includes a package substrate with an active bridge positioned therein. An active die may be coupled with the package substrate, and communicatively coupled with the active bridge. A photonic integrated circuit (PIC) may also be coupled with the package substrate and communicatively coupled with the active bridge. Other embodiments may be described or claimed.

15 Claims, 7 Drawing Sheets

(56) References Cited

U.S. PATENT DOCUMENTS

| | | | | |
|---|---|---|---|---|
| 6,853,758 B2* | 2/2005 | Ridgway | | H04B 10/2572 |
| | | | | 385/2 |
| 7,079,718 B2* | 7/2006 | Welch | | H01S 5/22 |
| | | | | 385/14 |
| 7,702,188 B2* | 4/2010 | Little | | G02B 6/126 |
| | | | | 385/5 |
| 8,543,005 B2* | 9/2013 | Binkert | | G06F 1/105 |
| | | | | 398/33 |
| 8,676,003 B2* | 3/2014 | Roelkens | | G02B 6/305 |
| | | | | 385/14 |
| 8,787,710 B2* | 7/2014 | Mizuno | | G02B 6/12007 |
| | | | | 385/11 |
| 9,091,813 B2* | 7/2015 | Dallesasse | | G02B 6/105 |
| 9,442,254 B2* | 9/2016 | Pelley | | G02B 6/3596 |
| 9,874,688 B2* | 1/2018 | Doerr | | G02B 6/4269 |
| 10,598,860 B2* | 3/2020 | Ramachandran | | G02B 6/4471 |
| 11,320,588 B1* | 5/2022 | Mazed | | G16H 10/40 |
| 11,804,452 B2* | 10/2023 | Polomoff | | G02B 6/13 |
| 2002/0039464 A1* | 4/2002 | Yoshimura | | H01L 24/24 |
| | | | | 257/E25.032 |
| 2002/0097962 A1* | 7/2002 | Yoshimura | | G02B 6/124 |
| | | | | 385/16 |
| 2003/0186476 A1* | 10/2003 | Naydenkov | | G02B 6/12007 |
| | | | | 438/26 |
| 2004/0008916 A1* | 1/2004 | Ridgway | | G02F 1/0136 |
| | | | | 385/2 |
| 2008/0031566 A1* | 2/2008 | Matsubara | | G02B 6/126 |
| | | | | 385/14 |
| 2010/0046886 A1* | 2/2010 | Doerr | | G02B 6/105 |
| | | | | 385/27 |
| 2010/0202724 A1* | 8/2010 | Little | | G02B 6/2773 |
| | | | | 385/5 |
| 2010/0303469 A1* | 12/2010 | Barton | | H04B 10/6151 |
| | | | | 29/428 |
| 2010/0303476 A1* | 12/2010 | Barton | | H04B 10/6151 |
| | | | | 359/489.08 |
| 2010/0322631 A1* | 12/2010 | Nagarajan | | G02B 6/12009 |
| | | | | 398/65 |
| 2011/0243556 A1* | 10/2011 | Nagarajan | | H04J 14/06 |
| | | | | 398/43 |
| 2012/0002971 A1* | 1/2012 | Doerr | | G02B 6/30 |
| | | | | 398/115 |
| 2012/0121216 A1* | 5/2012 | Oh | | G01R 15/246 |
| | | | | 385/1 |
| 2013/0142476 A1* | 6/2013 | Dallesasse | | G02F 1/0036 |
| | | | | 385/11 |
| 2014/0064659 A1* | 3/2014 | Doerr | | G02B 6/428 |
| | | | | 385/14 |
| 2014/0153862 A1* | 6/2014 | Picard | | G02B 6/126 |
| | | | | 385/11 |
| 2014/0355979 A1* | 12/2014 | Dorin | | G02F 1/2257 |
| | | | | 398/27 |
| 2015/0037044 A1* | 2/2015 | Peterson | | G02B 6/4292 |
| | | | | 398/135 |
| 2015/0219850 A1* | 8/2015 | Fish | | H04B 10/00 |
| | | | | 385/14 |
| 2016/0033728 A1* | 2/2016 | Kish, Jr. | | G02B 6/2773 |
| | | | | 385/14 |
| 2017/0108649 A1* | 4/2017 | Dallesasse | | G02F 1/093 |
| 2017/0194309 A1* | 7/2017 | Evans | | H01L 24/49 |
| 2017/0205578 A1* | 7/2017 | Van Thourhout | | G02B 6/126 |
| 2018/0277512 A1 | 9/2018 | Waidhas et al. | | |
| 2019/0137706 A1* | 5/2019 | Xie | | G02B 6/4202 |
| 2019/0324223 A1 | 10/2019 | Mm et al. | | |
| 2019/0391348 A1* | 12/2019 | Osenbach | | G02B 6/4246 |
| 2023/0084003 A1* | 3/2023 | Taha | | G02B 6/4228 |
| | | | | 385/31 |

* cited by examiner

ACTIVE BRIDGE ENABLED CO-PACKAGED PHOTONIC TRANSCEIVER

BACKGROUND

Off-package input/output (I/O) bandwidth has been increasing, which results in a desire for packaging and I/O technologies to scale to meet the I/O bandwidth demand. In many situations, increased bandwidth may be supported by increased signaling speeds and pin counts. Many legacy microelectronic packages may use electrical signaling.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature." may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As previously noted, legacy microelectronic packages may have been using electrical signaling to address increased bandwidth requirements. However, the electrical signal may be limited with respect to reach and power. Additionally, increasing pin counts (for example in the socket or the interconnects) may be difficult to sustain because of cost and integration concerns.

Embodiments herein relate to resolving power, reach, or pin-count concerns by co-packaging optics on the microelectronic package alongside a processor or other active die. In parallel, an active bridge may be embedded within the package substrate to provide improved cost, compaction, and performance. In general, co-packaged optics may offer power and bandwidth benefits in compact form factors. In addition, use of an active bridge may provide additional area, power, or size benefits.

Figure 1:
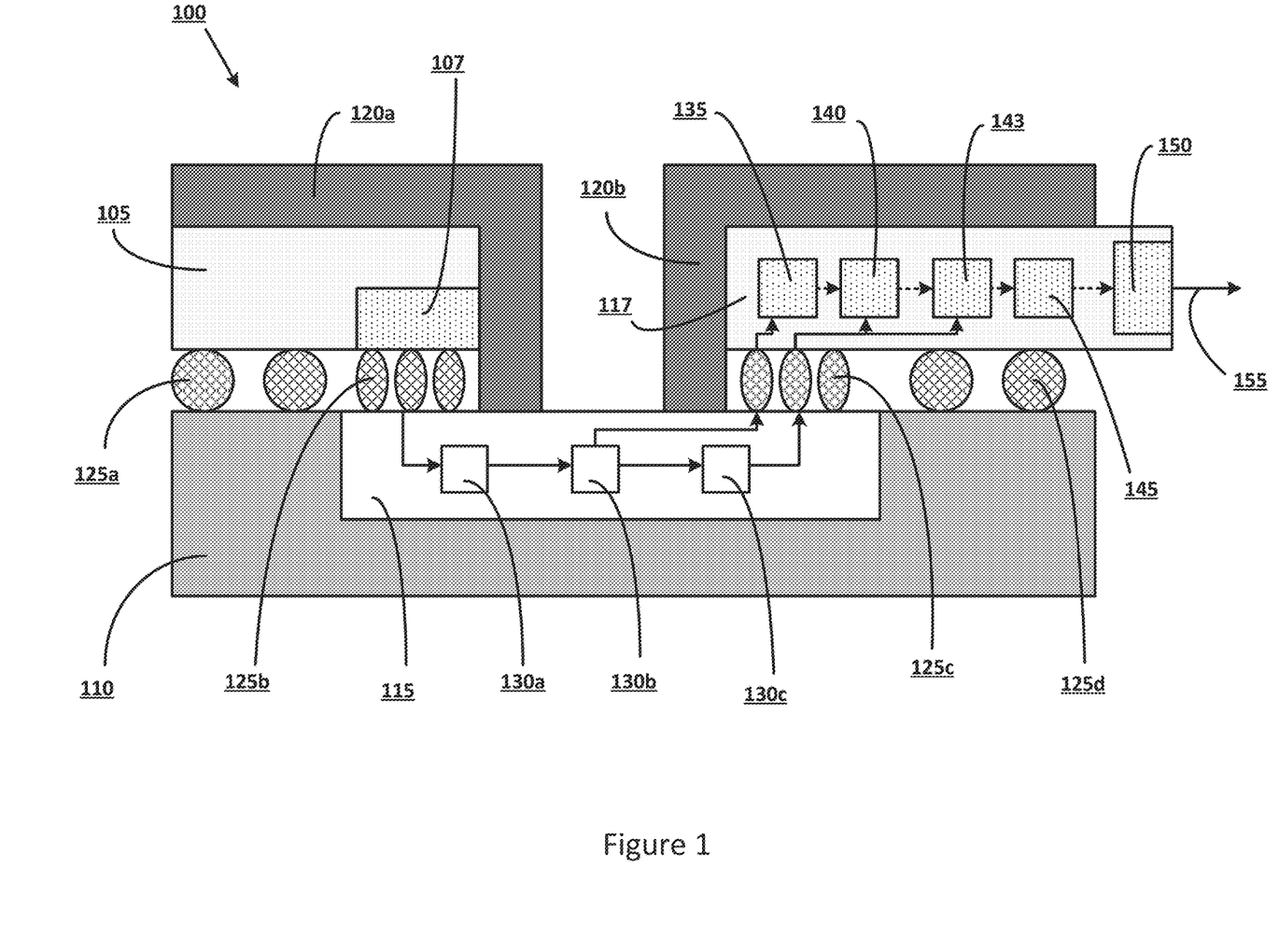
FIG. 1 depicts an example microelectronic package with an active bridge and a photonic transceiver, in accordance with various embodiments.

FIG. 1 depicts an example microelectronic package 100 with an active bridge and a photonic transceiver, in accordance with various embodiments. It will be understood that FIG. 1, and other Figures herein, are intended as sample Figures of various embodiments. Certain elements may be shown in a specific configuration or with a specific size or shape, however the specific relative sizes or the shapes of elements may vary in other embodiments. Additionally, real-world embodiments may have a variety of additional elements or structures that are not shown in FIG. 1 such as additional conductive elements, active elements, passive elements, structures like overmold or underfill, etc. Additionally, each and every element of the Figures (for example, the interconnects) may not be specifically enumerated in the Figure, however it will be understood that elements that share identical characteristics in the Figure may share characteristics with one another.

The microelectronic package 100 may include a die 105 coupled with a package substrate 110. The die 105 may be or include, for example, a processor such as a central processing unit (CPU), general processing unit (GPU), a core of a distributed processor, a field-programmable gate array (FPGA), or some other type of processor. Alternatively, the die 105 may be include a memory such as a double data rate (DDR) memory, a nonvolatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include an analog or mixed signal circuit that is configured to transmit or receive data. In some embodiments the die 105 may include one or more passive components such as capacitors, resistors, etc. The various active or passive components may be positioned within, partially within, or on the surface of the die 105.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate.

The microelectronic package 100 may further include a photonic transceiver. Generally, the photonic transceiver may include two portions. A first portion of the photonic transceiver may include the electronic integrated circuit (EIC), and a second portion of the photonic transceiver may include the photonic integrated circuit (PIC) 117. The PIC 117 may include one or more active or passive elements such as photoreceptors, one or more lasers, filters, etc. which may generate, process, alter, or otherwise affect an optical signal. The EIC may generally include one or more active or passive electrical components or circuits which may drive, process, or otherwise facilitate the operation of the PIC 117. The PIC 117 may be implemented in the microelectronic package 100 as a die that is coupled with the package substrate 110 as depicted in FIG. 1. The EIC may be implemented as a plurality of active elements of a bridge of the package substrate 110, as will be described in greater detail below.

The package substrate 110 may include an active bridge 115. In the embodiment of FIG. 1, the active bridge 115 may be a bridge that allows communicative coupling between two elements of the microelectronic package 100 (e.g., the active die 105 and the PIC 117). The active bridge 115 may be formed of a material such as silicon or some other material, and include one or more conductive elements (e.g., a pad, a trace, a microstrip, a stripline, a via, etc.) either in, on, or partially in the material of the active bridge 115. The active bridge 115 may further include one or more active elements such as logic, circuitry, memory, or some other active element in, on, or partially in the material of the active bridge 115. The active bridge 115 may further include one or more passive elements such as capacitor(s), resistor(s), inductor(s), etc. in, on, or partially within the material of the active bridge 115. In some embodiments, the active bridge 115 may be referred to as an embedded multi-die interconnect bridge (EMIB), though in other embodiments the active bridge 115 may be or may be referred to as another kind or type of active bridge.

FIG. 1 depicts three active elements 130a, 130b, and 130c (collectively, "active elements 130") in the active bridge 115. The active elements 130 may be active elements of an EIC of the photonic transceiver. For example, the active elements 130 may include: an active element such as a driver to provide or process control signals to an element of the PIC 117; a serializer/deserializer (SERDES) to serialize or deserialize one or more data or control signals received from the active die 105 for provision to the PIC 117; a control interface to alter, process, or generate one or more control signals for provision to the PIC 117; a transimpedance amplifier (TIA) to alter a voltage or current of a signal that is to be provided to the PIC 117; or some other active element. Additionally, the active elements 130 may include elements that are not associated with the EIC such as control logic, amplifiers, processors, filters, etc. As can be seen in FIG. 1, the active elements 130 may be coupled in a variety of ways such as having a serial or sequential path, parallel paths, or some other communication pathway.

The PIC 117 may likewise include a number of active or passive elements which may relate to an optical signal that is generated, received, processed, or otherwise affected by the PIC 117. In the embodiment of FIG. 1, the PIC 117 is shown to have circuitry related to the generation or transmission of an optical signal. However, in other embodiments, the PIC 117 may additionally or alternatively include circuitry related to the reception or processing of an optical signal. In other words, the PIC 117 of FIG. 1 may be shown to be related to an optical transmitter, however in other embodiments the PIC 117 of FIG. 1 may include circuitry related to an optical receiver or an optical transceiver.

In the embodiment of FIG. 1, the PIC 117 may include a laser 135 that is communicatively coupled with the active elements 130. The laser 135 may be configured to generate an optical signal, which is represented in FIG. 1 as the dashed line that proceeds through the PIC 117. In some embodiments, the optical signal may span a plurality of frequencies generated by a single or multiple lasers. It will be noted that although the embodiment of FIG. 1 is described as receiving the optical signal from an on-chip laser 135, in other embodiments the optical signal may be generated or received from a remote laser or lasers that are communicatively coupled with the PIC 117, e.g. by an optical fiber.

The optical signal may be provided from the laser 135 to the semiconductor optical amplifier 140 where the optical signal may be amplified or otherwise processed. The optical signal may then be provided from the amplifier 140 to a modulator 143 where the signal is modulated to encode data into the optical signal. In some embodiments, as shown, the modulator 143 may be communicatively coupled with one or more of active elements 130. Specifically, as shown, the modulator 143 may be communicatively coupled with active elements 130c through an interconnect 125c. In some embodiments, the active element 130c may provide the data that is to be encoded into the optical signal by the modulator 143.

The optical signal may then be provided to other active and/or passive elements including but not limited to splitters, power monitors, multiplexers and mode converters. An example is a spot size converter (SSC) 145. The SSC 145 may expand the physical cross-sectional size of the optical signal to improve fiber coupling efficiency. The optical signal may then be provided to a Vgroove 150 to facilitate coupling of the optical signal to an optical fiber. The optical signal may then be output as a transmitted optical signal at 155. Specifically, the PIC 117 may be communicatively coupled with another element of an electronic device of which the microelectronic package 100 is a part. Such an element may include, for example, an optical fiber, a waveguide, another active or passive component, a bridge, etc.

The microelectronic package 100 may further include a variety of additional elements. For example, in some embodiments the active die 105 may include one or more die I/Os 107. The die I/O 107 may facilitate communication between the active die 105 and one or more elements to which the active die 105 is coupled (e.g., the package substrate 110). The die I/O 107 may include one or more active elements such as logic or other circuitry, passive elements such as resistors/capacitors/etc., or circuitry to provide die fan-out to a specific pitch which may be used to couple the active die 105 to the substrate.

The microelectronic package 100 may further include a plurality of interconnects 125a, 125b, 125c, and 125d (collectively referred to as "interconnects 125"). The interconnects 125 may be, for example, solder bumps that are formed of a material such as tin, silver, copper, etc. If solder bumps are used for the interconnects 125, then the solder bumps may be flip-chip bumps as shown in FIG. 1. In other embodiments, the interconnects 125 may be elements of a ball-grid array (BGA), pins of a pin grid array (PGA), elements of a land grid array (LGA), or some other type of interconnect. Generally, the interconnects 125 may physically or communicatively couple the active die 105 or the PIC 117 with the package substrate 110, and specifically the active bridge 115. For example, one or more of the interconnects 125 may physically couple with, and allow electrical signals to pass between, pads of the active die 105/PIC 117 and pads of the package substrate 110/active bridge 115 (pads not shown for the sake of elimination of clutter of FIG. 1). In other embodiments, the interconnects 125 may physically couple the active die 105 and the package substrate 110, but the interconnects 125 may not communicatively couple the active die 105 or the PIC 117 and the package substrate 110.

As can be seen, the interconnects 125 may not have a uniform size, shape, or pitch. For example, the interconnects 125a that couple the active die 105 to the package substrate 110 may be larger, and have a larger pitch (e.g., distance from the center of one interconnect to the center of another interconnect) than the interconnects 125b. Similarly, the interconnects 125d that couple the PIC 117 to the package substrate 110 may be larger, and have a larger pitch, than the interconnects 125c. The finer pitch of interconnects 125b and 125c may be desirable to allow a denser communication pathway between the active bridge 115 and the elements coupled to the active bridge. It will also be understood that in other embodiments, the size, shape, pitch, or type of one or more of the interconnects 125 may be different than depicted in FIG. 1, or than others of the interconnects 125. The specific type, size, shape, or pitch of the various interconnects 125 may be based on one or more factors such as use case, materials used, design considerations, manufacturing considerations, etc.

The microelectronic package 100 may further include one or more integrated heat spreaders (IHSs) such as IHSs 120a and 120b (collectively, "IHSs 120"). The IHSs 120 may be formed of a thermally conductive material such as copper or some other material. The IHSs 120 may couple with a thermal solution such as a vapor chamber, a water-cooled cooling apparatus, fins, or some other type of thermal solution. The thermal solution is not depicted in FIG. 1 for the sake of reduction of clutter of the Figure. In operation, the IHSs 120 may serve to draw thermal energy from the active die 105 or the PIC 117. The thermal energy may be generated through operation of the active die 105/PIC 117. The thermal energy may travel to the IHSs 120 where the thermal energy may then be dispersed through the IHSs 120. Specifically, the IHSs 120 may transfer the thermal energy to the thermal solution where the thermal energy may be dispersed away from the microelectronic package 100.

As noted, it will be understood that FIG. 1 (and other Figures herein) are intended as example embodiments. The specific location of various of the elements may be different in other embodiments, or in real-world embodiments. For example, the active bridge 115 may not be flush with the surface of the package substrate 110, but rather may at least partially protrude from the package substrate 110 or be embedded in an inner layer of the package substrate 110. Various of the elements depicted such as the active elements 130 or the elements of the PIC 117 may be at the surface of, or at least partially protruding from, the active bridge 115 or the PIC 117. Additionally, the specific number of elements such as the number of active elements 130, the number of interconnects 125, etc. may be different in other embodiments. In some embodiments the microelectronic package 100 (or some other microelectronic package discussed herein) may include an adhesive, a sealant, an underfill, a mold/overmold, or some other structural or dielectric material. In some embodiments, certain elements, for example elements of the PIC 117, may be positioned at a different location within the signal path relative to other elements of the PIC 117. For example, the modulator 143 may be positioned in the signal path prior to the amplifier 140, there may be a plurality of amplifiers on either side of the modulator 143, there may be an amplifier after the SSC 145, etc.

Figure 2:
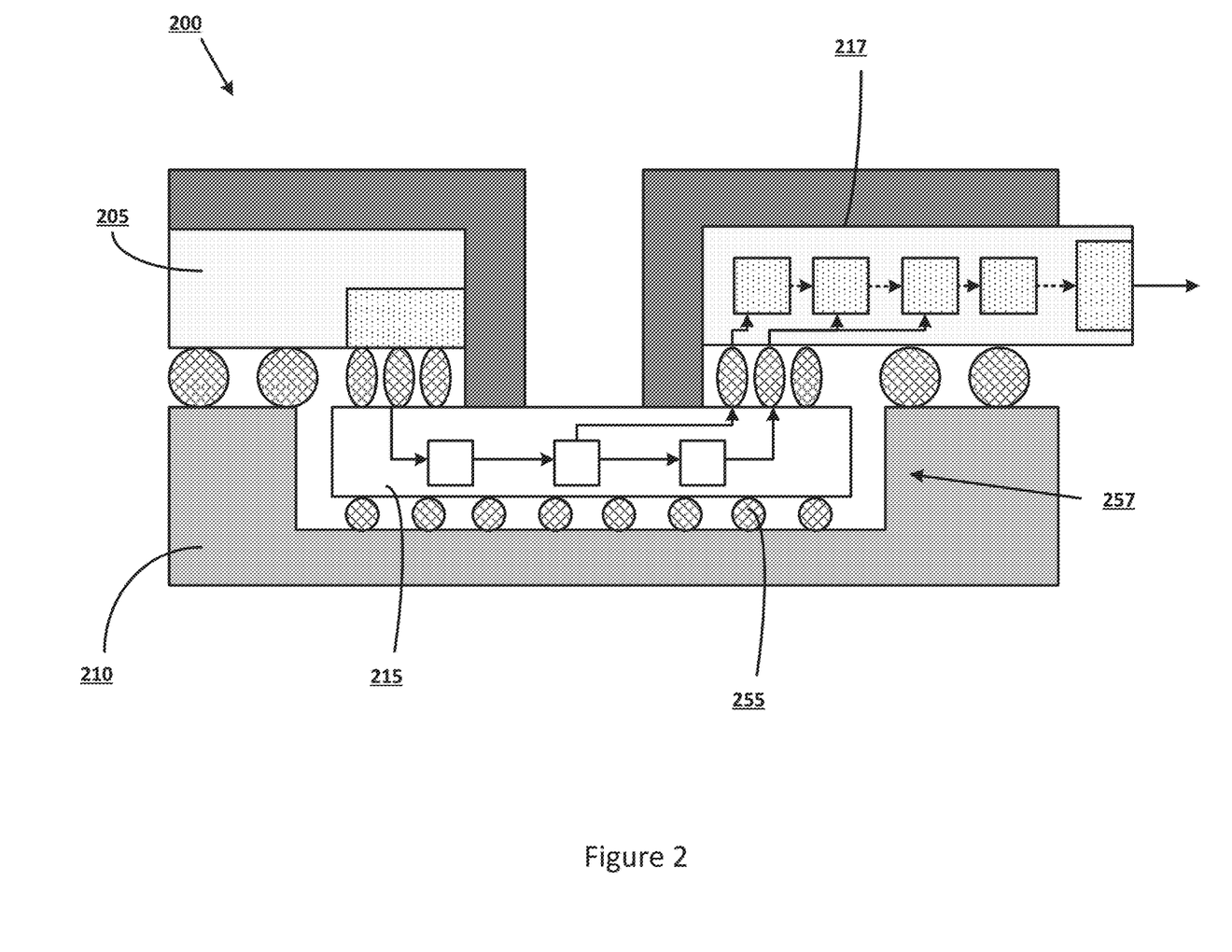
FIG. 2 depicts an alternative example microelectronic package with an active bridge and a photonic transceiver, in accordance with various embodiments.

FIG. 2 depicts an alternative example microelectronic package 200 with an active bridge 215 and a photonic transceiver, in accordance with various embodiments. Specifically, the microelectronic package 200 may include an active die 205, a package substrate 210, an active bridge 215, and a PIC 217 which may be respectively similar to, and share one or more characteristics with, active die 105, package substrate 110, active bridge 115, and PIC 117. It will be understood that the microelectronic package 200 may include additional elements such as those depicted and discussed with respect to FIG. 1, however those elements are not specifically enumerated in FIG. 2 for the sake of lack of redundancy of the Figure and description.

As may be seen, in FIG. 2, the active bridge 215 may be an open cavity bridge (OCB) rather than the EMIB of FIG. 1. Specifically, the package substrate 210 may include a cavity 257 which may be mechanically drilled, etched, chemically etched, photolithographically defined, etc. The active bridge 215 may be positioned in the cavity 257 and coupled with the package substrate 210. As seen in FIG. 2, the active bridge 215 may be coupled with the package substrate 210 by interconnects 255 which may be similar to, and share one or more characteristics with, one or more of interconnects 125. In other embodiments, the active bridge 215 may additionally or alternatively be coupled with the package substrate 210 through another coupling technique such as a socket, adhesive, or some other type of coupling.

Figure 3:
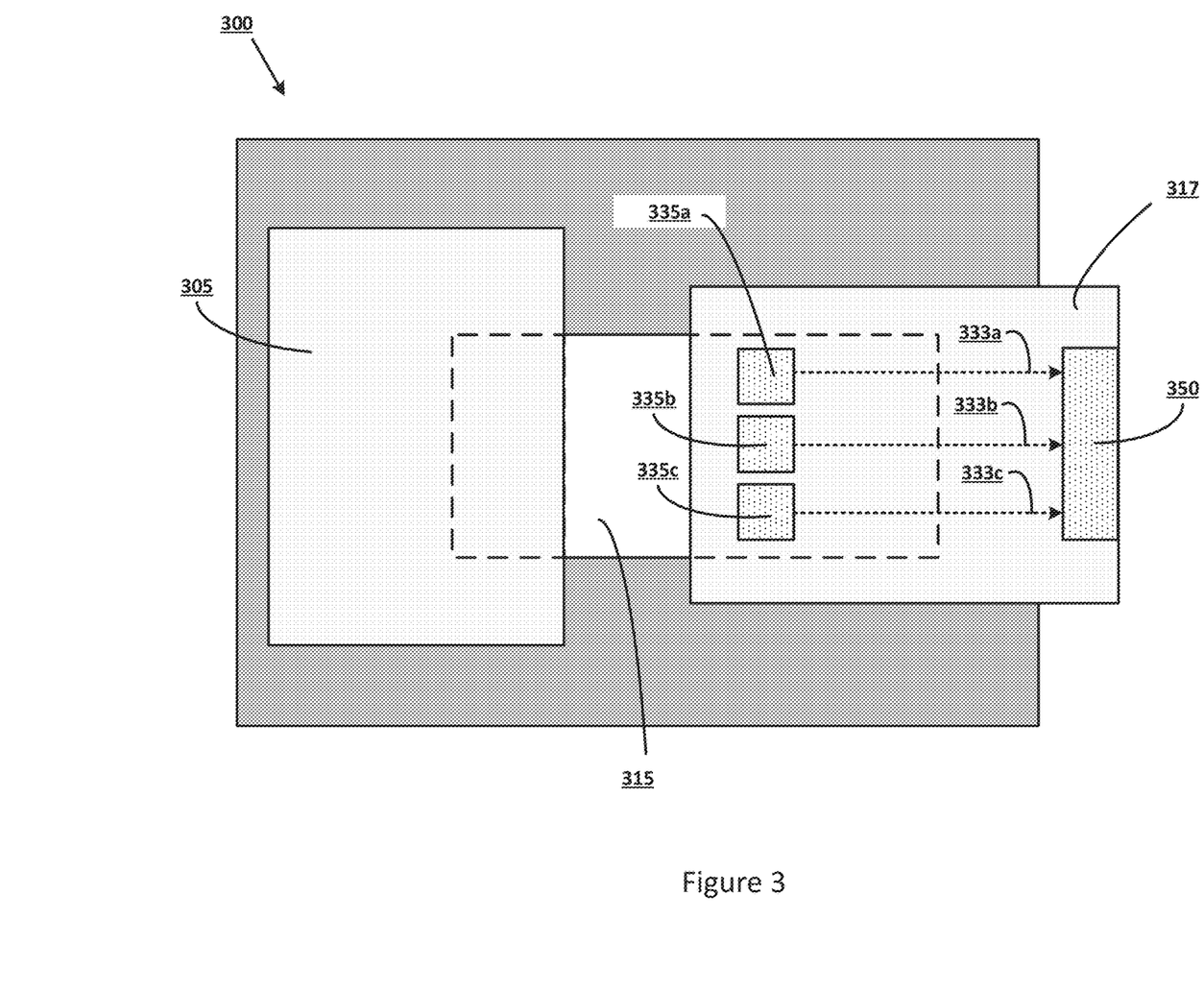
FIG. 3 depicts a top-down view of an example microelectronic package with an active bridge and a photonic transceiver, in accordance with various embodiments.

FIG. 3 depicts a top-down view of an example microelectronic package 300 with an active bridge and a photonic transceiver, in accordance with various embodiments.

Generally, the microelectronic package 300 may include elements similar to those of microelectronic packages 100 or 200. It will be understood that the microelectronic package 300 of FIG. 3 is intended as a highly simplified example embodiment, and may not include all of the elements which may be present in real-world embodiments, or which may be depicted in FIG. 1 or 2. For example, in some embodiments the microelectronic package 300 may include additional active, passive, or conductive elements which are not depicted in FIG. 3. Additionally, it will be understood that the view of FIG. 3 is not intended to be taken across any specific cross-sectional plane of FIG. 1 or 2, but rather is designed to show the overlap and relative positioning of certain elements. However, it will be noted that the specific positions, relative sizes, shapes, or degree of overlap of certain of the depicted elements may only be shown herein for the sake of illustration and discussion, and may vary in other embodiments. It will also be understood that only three lasers and three optical signal paths are depicted in FIG. 3, other embodiments may have more or fewer lasers or optical signal paths.

The microelectronic package 300 may include an active die 305, an active bridge 315, and a PIC 317 which may be respectively similar to, and share one or more characteristics with active dies 105/205, active bridges 115/215, and PICs 117/217. The PIC 317 may include a number of lasers 335*a*, 335*b*, and 335*c*, which may be respectively similar to, and share one or more characteristics with laser 135. The PIC 317 may additionally include and Vgroove 350 which may be similar to, and share one or more characteristics with, Vgroove 150.

Respective ones of the lasers 335*a*/335*b*/335*c* may produce an optical signal that propagates along an optical signal path 333*a*/333*b*/333*c*. Each of the optical paths 333*a*/333*b*/333*c* may be similar to the optical signal path discussed above with respect to FIG. 1 and the PIC 117 of FIG. 1. Specifically, the PIC 317 may include a variety of elements such as a modulator, an amplifier, an SCC, etc. as described above with respect to FIG. 1. However, those elements of the PIC 317 are not depicted in FIG. 3 for the sake of clarity of the Figure. Each of the respective optical signal paths 333*a*/333*b*/333*c* may include each of the elements depicted in the PIC 117 of FIG. 1, while in other embodiments certain of the elements may be shared between certain of the optical signal paths 333*a*/333*b*/333*c*. For example, two of the optical signal paths may share an SSC, an amplifier, or some other element of the PIC 317.

Figure 4:
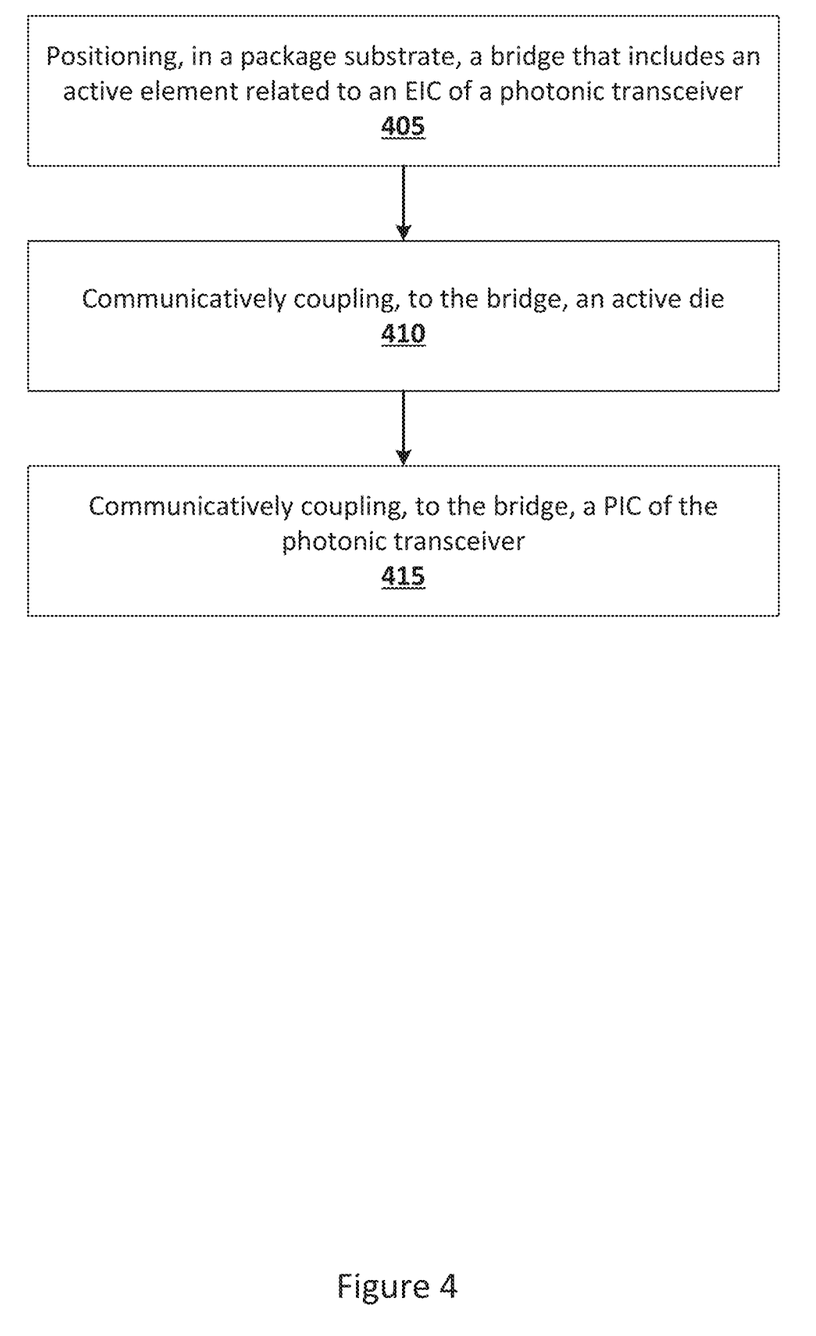
FIG. 4 depicts an example technique for the manufacture of a microelectronic package with an active bridge and a photonic transceiver, in accordance with various embodiments.

FIG. 4 depicts an example technique for the manufacture of a microelectronic package with an active bridge and a photonic transceiver, in accordance with various embodiments. It will be understood that FIG. 4 is intended as a high-level example technique, and other embodiments may include additional elements not depicted in FIG. 4. Additionally, FIG. 4 will be described herein with reference to elements of FIG. 1, however it will be understood that the technique may be applicable, in whole or in part, with or without modification, to other embodiments of the present disclosure.

The technique may include positioning, at 405, in a package substrate, a bridge that includes an active element related to an EIC of a photonic transceiver. The package substrate may be similar to, for example, package substrate 110. The bridge may be similar to, for example, active bridge 115. The active elements may be similar to, for example, one or more of active elements 130. Positioning the bridge in the package substrate may include etching a cavity in the package substrate and then positioning the bridge in the cavity, laminating layers of the package substrate onto the bridge, or some other manufacturing technique. The specific technique used may depend on the specific elements used, the use cases to which the microelectronic package may be put, or some other factor.

The technique may further include communicatively coupling, at 410, to the bridge, an active die. The active die may be similar to, for example, active die 105. Communicatively coupling the active die to the bridge may include positioning the active die against the substrate or the active bridge, and then performing an interconnect-attach process such as solder-reflow or some other technique.

The technique may further include communicatively coupling, at 415, to the bridge, a PIC of the photonic transceiver. The PIC may be similar to, for example, PIC 117. Communicatively coupling the PIC to the bridge may include positioning the PIC against the substrate or the active bridge, and then performing an interconnect-attach process such as solder-reflow or some other technique.

As noted, FIG. 4 is intended as a high-level example technique. In some embodiments, certain elements may be performed in a different order than depicted. For example, element 415 may be performed prior to, or concurrently with, element 410. Other variations may be present in other embodiments.

Figure 5:
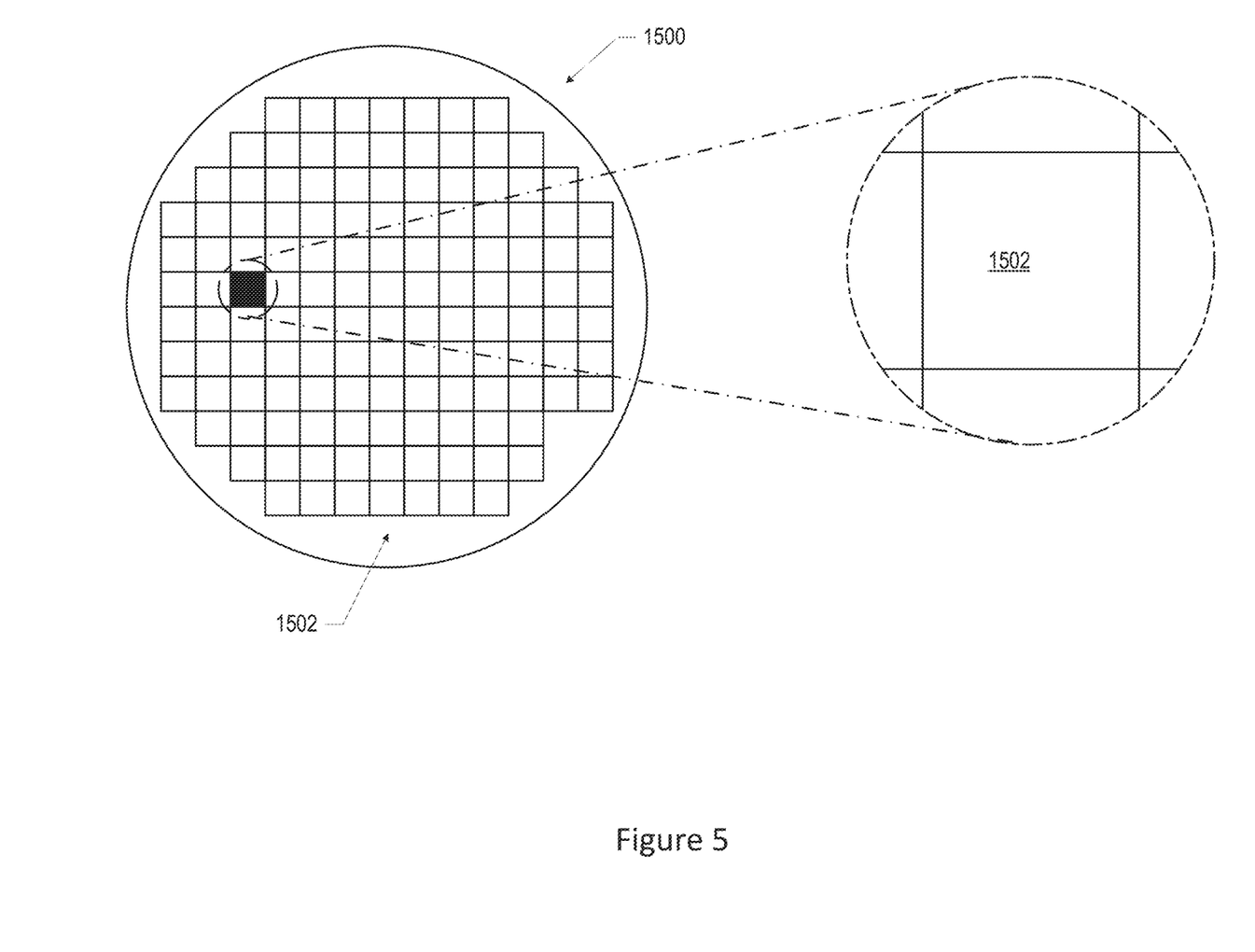
FIG. 5 is a top view of a wafer and dies that may include a microelectronic package with an active bridge and a photonic transceiver, in accordance with various embodiments.

FIG. 5 is a top view of a wafer 1500 and dies 1502 that may include, or be included in, one or more microelectronic packages with an active bridge and a photonic transceiver, in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may be included in a microelectronic package with an active bridge and a photonic transceiver, one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 7) or other logic that is configured to store information in the memory devices or execute instructions stored in the memory array.

Figure 6:
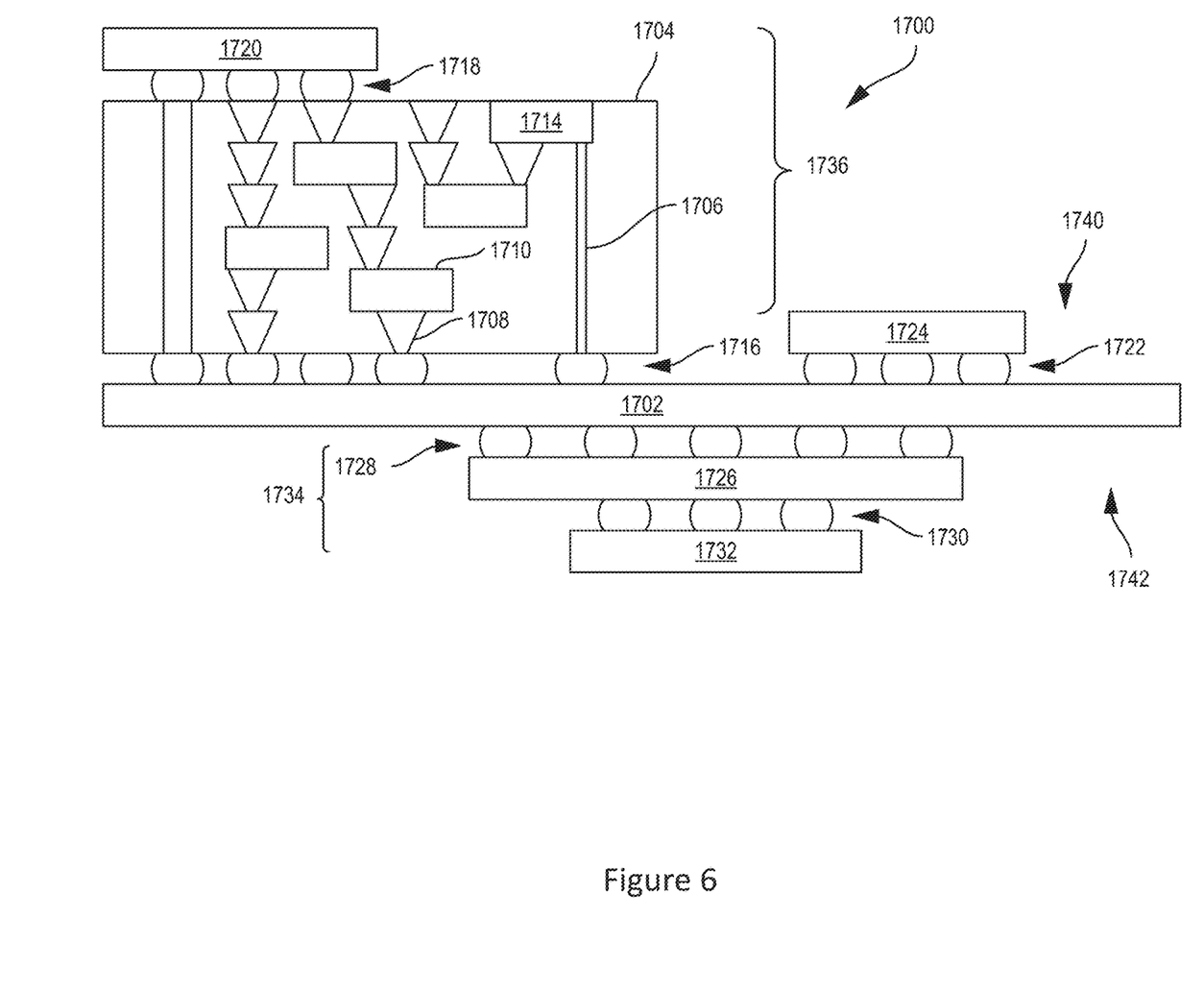
FIG. 6 is a side, cross-sectional view of an integrated circuit (IC) device assembly that may include a microelectronic package with an active bridge and a photonic transceiver, in accordance with various embodiments.

FIG. 6 is a side, cross-sectional view of an IC device assembly 1700 that may include, or be included in, one or more IC packages or other electronic components (e.g., a die) with an active bridge and a photonic transceiver, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 6 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 6), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 6, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 5), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 6, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more active bridges as discussed herein.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 6 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 7:
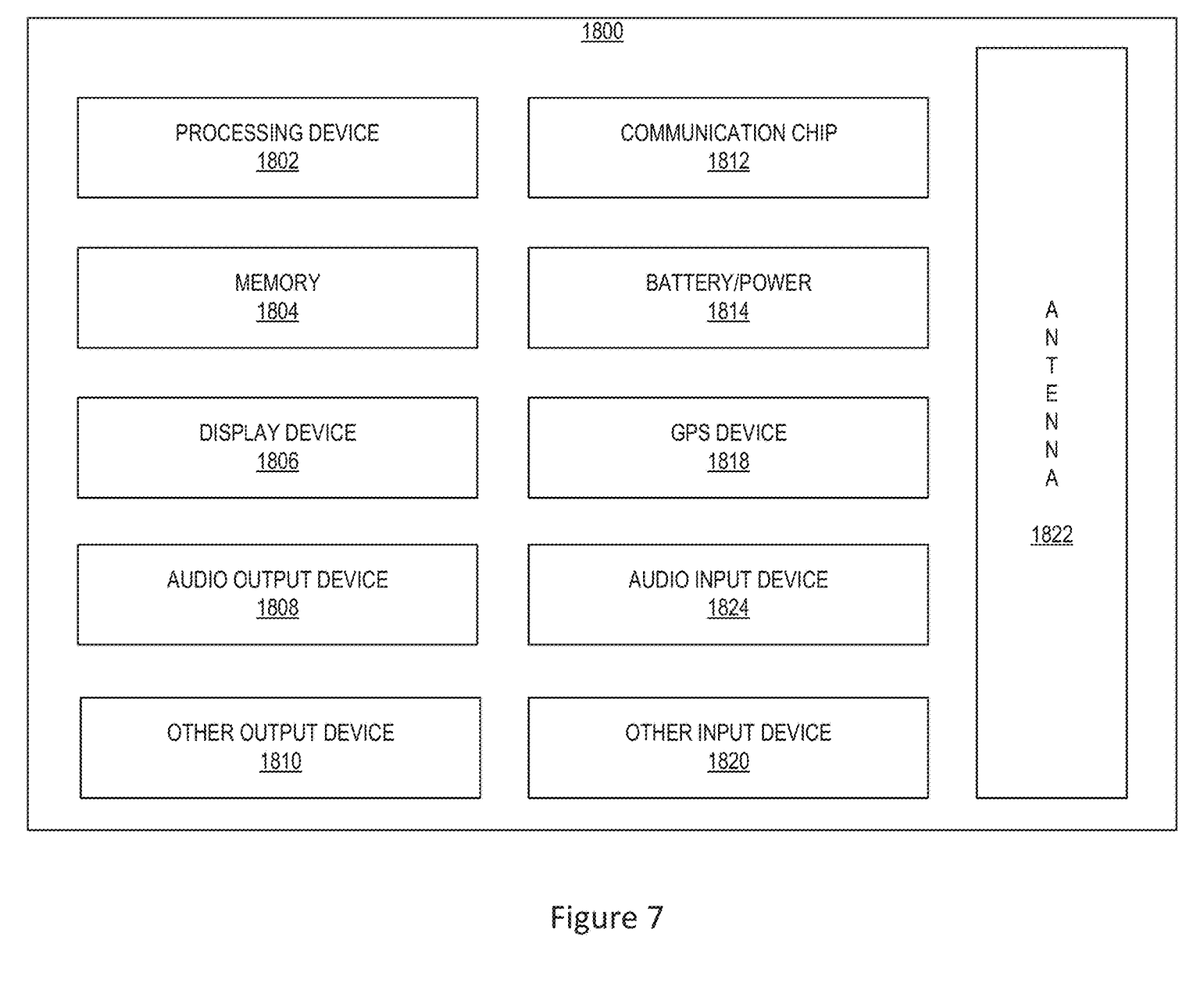
FIG. 7 is a block diagram of an example electrical device that may include a microelectronic package with an active bridge and a photonic transceiver, in accordance with various embodiments.

FIG. 7 is a block diagram of an example electrical device 1800 that may include one or more microelectronic packages with an active bridge and a photonic transceiver, in accordance with any of the embodiments disclosed herein. For example, any suitable ones of the components of the electrical device 1800 may include one or more of the IC device assemblies 1700, IC packages, IC devices, or dies 1502 disclosed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, graphics processing units, GPUS, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic RAM (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic RAM (eDRAM) or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a microelectronic package comprising: a package substrate with an active bridge positioned therein; an active die coupled with the package substrate, wherein the active die is communicatively coupled with the active bridge; and a PIC coupled with the package substrate, wherein the PIC is communicatively coupled with the active bridge.

Example 2 includes the microelectronic package of example 1, wherein the active bridge includes an active circuit element that is to alter a signal that is propagating through the active bridge.

Example 3 includes the microelectronic package of example 2, wherein the active circuit element is a serializer/deserializer (SERDES), a transimpedance amplifier (TIA), a control interface, or a driver.

Example 4 includes the microelectronic package of example 2, wherein the active circuit element is an element of an EIC of a photonic transceiver that includes the PIC.

Example 5 includes the microelectronic package of any of examples 1-4, wherein the PIC includes an optical element.

Example 6 includes the microelectronic package of any of examples 1-4, wherein the active die is a processor.

Example 7 includes the microelectronic package of any of examples 1-4, wherein the active bridge facilitates communication between the active die and the PIC.

Example 8 includes the microelectronic package of example 7, wherein the active bridge facilitates the communication without the use of a retimer.

Example 9 includes a microelectronic package comprising: a package substrate with a bridge embedded therein; an active die coupled with the package substrate; and a photonic transceiver that includes a PIC and an EIC; wherein the EIC is an element of the bridge; and wherein the PIC is an element of a die that is coupled with the package substrate.

Example 10 includes the microelectronic package of example 9, wherein the bridge is communicatively coupled with the active die and the PIC.

Example 11 includes the microelectronic package of example 9, wherein the bridge is to facilitate communication of an electrical signal between the die and the PIC.

Example 12 includes the microelectronic package of example 9, wherein the bridge is an EMIB.

Example 13 includes the microelectronic package of any of examples 9-12, wherein the EIC includes a serializer/deserializer (SERDES), a transimpedance amplifier (TIA), a control interface, or a driver.

Example 14 includes the microelectronic package of any of examples 9-12, wherein the PIC includes a plurality of optical signal paths.

Example 15 includes a photonic transceiver comprising: a PIC portion that is to couple with a package substrate of a microelectronic package; and an EIC portion that is to be embedded in a bridge of the package substrate, wherein the EIC portion is to be coupled with the PIC portion by a first-level interconnect (FLI).

Example 16 includes the photonic transceiver of example 15, wherein the EIC portion includes a serializer/deserializer (SERDES), a transimpedance amplifier (TIA), a control interface, or a driver that are to be embedded in the bridge.

Example 17 includes the photonic transceiver of example 15, wherein the bridge is a photonic bridge that is to facilitate optical communication between the PIC and an active die coupled with the bridge.

Example 18 includes the photonic transceiver of example 15, wherein the bridge is an EMIB that is facilitate electrical communication between the PIC and an active die coupled with the bridge.

Example 19 includes the photonic transceiver of any of examples 15-18, wherein the PIC portion includes an optical transmitter that is to transmit an optical signal.

Example 20 includes the photonic transceiver of any of examples 15-18, wherein the PIC portion includes an optical receiver.

Example 21 includes a method of forming a microelectronic package, wherein the method comprises: positioning, in a package substrate, a bridge that includes an active element related to an EIC of a photonic transceiver; communicatively coupling, to the bridge, an active die; and communicatively coupling, to the bridge, a PIC of the photonic transceiver.

Example 22 includes the method of example 21, wherein the active element is a serializer/deserializer (SERDES), a transimpedance amplifier (TIA), a control interface, or a driver.

Example 23 includes the method of example 21, wherein the bridge is an EMIB.

Example 24 includes the method of any of examples 21-23, wherein communicatively coupling the active die to the bridge includes coupling the active die to the bridge by a solder-based interconnect.

Example 25 includes the method of any of examples 21-23, wherein communicatively coupling the PIC to the bridge includes coupling the PIC to the bridge by a solder-based interconnect.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:
1. A microelectronic package, comprising:
a package substrate comprising a bridge;

a die coupled with the package substrate, wherein the die is communicatively coupled with the bridge; and a photonic integrated circuit (PIC) communicatively coupled with the bridge, wherein the bridge is to facilitate communication between the die and the PIC without a retimer, the bridge includes a circuit element that is to alter a signal that is to propagate through the bridge, and the circuit element is an element of an electronic integrated circuit (EIC) of a photonic transceiver that includes the PIC.

2. The microelectronic package of claim 1, wherein the PIC includes an optical element.

3. The microelectronic package of claim 1, wherein the bridge is an active bridge, and the die is an active die.

4. The microelectronic package of claim 1, further comprising the EIC, wherein the EIC includes a serializer/deserializer (SERDES), a transimpedance amplifier (TIA), a control interface, or a driver embedded in the bridge.

5. The microelectronic package of claim 1, wherein the PIC includes an optical transmitter to transmit an optical signal.

6. The microelectronic package of claim 1, wherein the PIC includes an optical receiver.

7. A microelectronic package, comprising:
a package substrate with a bridge embedded therein;
an active die coupled with the package substrate; and
a photonic transceiver that includes a photonic integrated circuit (PIC) and an electronic integrated circuit (EIC);
wherein the EIC is an element of the bridge; and
wherein the PIC is an element of a die that is coupled with the package substrate.

8. The microelectronic package of claim 7, wherein the bridge is communicatively coupled with the active die and the PIC.

9. The microelectronic package of claim 7, wherein the bridge is to facilitate communication of an electrical signal between the die and the PIC.

10. The microelectronic package of claim 7, wherein the bridge is an embedded multi-die interconnect bridge (EMIB).

11. The microelectronic package of claim 1, wherein the circuit element is a serializer/deserializer (SERDES), a transimpedance amplifier (TIA), a control interface, or a driver.

12. The microelectronic package of claim 7, wherein the EIC includes a serializer/deserializer (SERDES), a transimpedance amplifier (TIA), a control interface, or a driver.

13. The microelectronic package of claim 7, wherein the PIC includes a plurality of optical signal paths.

14. A microelectronic package, comprising:
a package substrate with a bridge positioned therein;
a die coupled with the package substrate, wherein the die is communicatively coupled with the bridge; and
a photonic integrated circuit (PIC) coupled with the package substrate, wherein the PIC is communicatively coupled with the bridge,
wherein the bridge includes a circuit element that is to alter a signal to propagate through the bridge, and wherein the circuit element is an element of an electronic integrated circuit (EIC) of a photonic transceiver that includes the PIC.

15. The microelectronic package of claim 14, wherein the circuit element is a serializer/deserializer (SERDES), a transimpedance amplifier (TIA), a control interface, or a driver.

* * * * *